(12) United States Patent
Engelmann et al.

(10) Patent No.: US 10,529,633 B2
(45) Date of Patent: Jan. 7, 2020

(54) METHOD OF INTEGRATED CIRCUIT (IC) CHIP FABRICATION

(71) Applicant: International Business Machines Corporation, Armonk, NY (US)

(72) Inventors: Sebastian U. Engelmann, White Plains, NY (US); Eric A. Joseph, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/833,866

(22) Filed: Dec. 6, 2017

(65) Prior Publication Data

US 2019/0172762 A1    Jun. 6, 2019

(51) Int. Cl.
*H01L 21/308* (2006.01)
*H01L 21/66* (2006.01)
*H01L 21/311* (2006.01)
*H01L 21/02* (2006.01)
*H01L 21/3065* (2006.01)
*H01L 21/265* (2006.01)

(52) U.S. Cl.
CPC .......... *H01L 22/26* (2013.01); *H01L 21/0228* (2013.01); *H01L 21/265* (2013.01); *H01L 21/30655* (2013.01); *H01L 21/31116* (2013.01); *H01L 21/31144* (2013.01)

(58) Field of Classification Search
CPC . H01L 22/26; H01L 21/30655; H01L 21/265; H01L 21/0228; H01L 21/308
USPC .............................................. 216/59, 61, 67
See application file for complete search history.

(56) References Cited

U.S. PATENT DOCUMENTS

| | | | |
|---|---|---|---|
| 8,716,149 B2 | 5/2014 | Koehler et al. | |
| 9,368,591 B2 | 6/2016 | Bentley et al. | |
| 9,728,421 B2 | 8/2017 | Brink et al. | |
| 9,754,798 B1 | 9/2017 | Bi et al. | |
| 2008/0179715 A1 | 7/2008 | Coppa | |
| 2012/0048831 A1* | 3/2012 | Rueger | H01J 37/32009 216/67 |
| 2016/0020335 A1 | 1/2016 | Bentley et al. | |
| 2016/0196969 A1* | 7/2016 | Berry, III | H01L 21/02057 438/694 |
| 2017/0221781 A1* | 8/2017 | Theisen | H01L 21/31116 |
| 2017/0256463 A1* | 9/2017 | Bailey, III | H01L 22/12 |
| 2018/0068831 A1* | 3/2018 | Chen | H01J 37/32009 |
| 2018/0182632 A1* | 6/2018 | Feng | H01L 22/26 |

FOREIGN PATENT DOCUMENTS

WO    2017099718 A1    6/2017

* cited by examiner

*Primary Examiner* — Binh X Tran
(74) *Attorney, Agent, or Firm* — Law Office of Charles W. Peterson, Jr.; Louis J. Percello, Esq.; Erik K. Johnson, Esq.

(57) ABSTRACT

A method of forming integrated circuit (IC) chips. After masking a layer of a material to be etched, the layer is subjected to an atomic layer etch (ALE). During the ALE, etch effluent is measured with a calorimetric probe. The calorimetric probe results reflect a species of particles resulting from etching the material. The measured etch results are checked until the results indicate the particle content is below a threshold value. When the content is below the threshold ALE is complete and IC chip fabrication continues normally.

17 Claims, 2 Drawing Sheets

| %N₂ | EPM POWER CHANGE (mW) | S/N |
|---|---|---|
| 10 | 0.51 | 13 |
| 5 | 0.24 | 6 |
| 3 | 0.13 | 3 |
| 1 | 0.09 | 2 |

Fig. 3

| PRESSURE (torr) | POWER CHANGE @ 10% N₂ (mW) |
|---|---|
| 0.34 | 1.3 |
| 1 | 1.9 |
| 2 | 2.3 |
| 3 | 2.3 |
| 4 | 2.4 |
| 5 | 2.4 |

Fig. 4

METHOD OF INTEGRATED CIRCUIT (IC) CHIP FABRICATION

BACKGROUND

Field of the Invention

The present invention is related to semiconductor manufacturing and particularly to precisely and efficiently etching semiconductor manufacturing layers.

Background Description

Primary integrated circuit (IC) chip manufacturing goals include increasing chip density and performance at minimized power consumption, i.e., packing more function operating at higher speeds in the same or smaller space. Transistors or devices are formed by stacking layers of shapes on the IC, e.g., printed layer by layer on a wafer using photolithographic techniques. A simple field effect transistor (FET), or device, includes a gate above a semiconductor channel, a dielectric gate sidewall spacer, e.g., nitride, over source/drain extensions at each end of the channel, and source/drain regions outboard of the gate sidewall spacers. Shrinking/reducing chip layer thicknesses and feature sizes to increase density and performance provides a corresponding reduction in minimum device dimensions and spacing.

However, shrinking features and reducing thicknesses requires more precise process control for state of the art and newer IC fabrication. RIE has worked well for typical semiconductor manufacturing processes, but it is too coarse for much finer features and much thinner layer in leading edge technologies. Atomic Layer Etching (ALE) offers atomic scale precision and better-control than RIE. Unfortunately, because of the different nature ALE, RIE control approaches have not transferred to ALE.

ALE uses a sequence alternating between self-limiting chemical modification and etching. For example, chlorine reacting with a silicon surface may alternate with etching in argon ions in an argon plasma etch. The chemical modification steps only alter specific areas of the top atomic layers of the wafer being etched. The etching steps remove only the chemically-modified material from those area. With adequate control ALE provides for precisely removing individual atomic layers, but process control has not previously been addressed and commercial ALE use has been plagued with throughput problems.

Thus, there is a need for precise and efficient Atomic Layer Etch (ALE) controls in semiconductor manufacturing and more particularly for monitoring ALE to precisely determine when the etch is complete without over-etching or unintentionally etching previously formed layers or features.

SUMMARY

A feature of the invention is control of Atomic Layer Etch (ALE) in integrated circuit (IC) chip fabrication;

Another feature of the invention is a measure of progress of ALE of a semiconductor manufacturing layer and an indication of when etch end point is reached;

Yet another feature of the invention is a way to measure and monitor ALE in semiconductor manufacturing during IC chip fabrication doe identifying etch end point.

The present invention relates to a method of forming integrated circuit (IC) chips. After masking a layer of a material to be etched, the layer is subjected to an atomic layer etch (ALE). During the ALE, etch effluent is measured with a calorimetric probe. The calorimetric probe results reflect a species of particles resulting from etching the material. The measured etch results are checked until the results indicate the particle content is below a threshold value. When the content is below the threshold ALE is complete and IC chip fabrication continues normally.

BRIEF DESCRIPTION OF THE DRAWINGS

The foregoing and other objects, aspects and advantages will be better understood from the following detailed description of a preferred embodiment of the invention with reference to the drawings, in which:

FIG. 3 shows a tabular example for determining a minimum detection level of nitrogen in argon in etch chamber effluent;

FIG. 4 shows a tabular example comparing sensitivity of detectable power with etch chamber pressure.

DETAILED DESCRIPTION

ALE has removal rates of around one atomic layer per second. Such precision requires sophisticated gas handling to monitor progress and determine when etching is complete. A conventional, state of the art Reactive Ion Etch (RIE) throws off excited particles from the etched layer material. Those excited particles are vented in the RIE gas phase, and can be measured with optical emission spectroscopy as an indication of etch progress. So, manufacturers use an optical spectrometer to measure dislodged fractions of those etched, excited particles in the gas phase. When the optical spectrometer measures excited particles below some threshold, etching is complete and the next fabrication step may begin. However, optical emission spectroscopy provides too coarse a measurement for the single layer etching done with ALE.

Thus, according to a preferred embodiment of the present invention, Integrated Circuit (IC) fabrication uses a calorimetric probe to monitor ALE effluent and identify the etching endpoint for a material from a layer being etched. The cyclic nature of the etch decomposes the etched layer over time. Monitoring the ALE effluent with a calorimetric probe, e.g., a thermoelectric probe, makes a clear identification of a single etched species possible for identifying the etch endpoint (EP).

Figure 1:
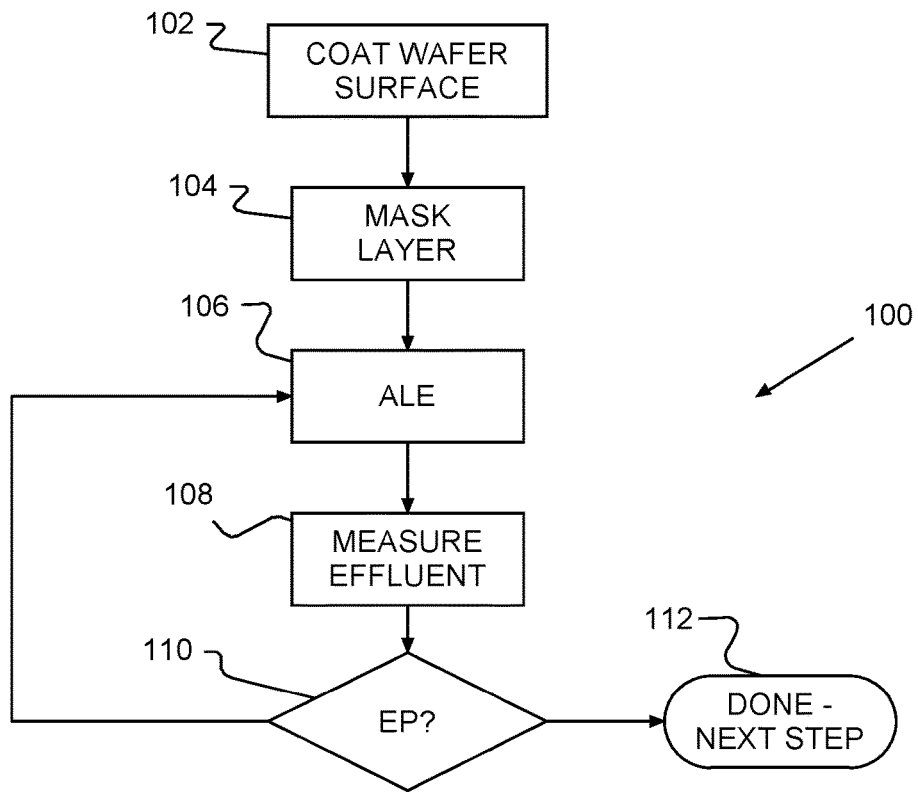
FIG. 1 shows an example of an example of monitoring ALE effluent 100 with a calorimetric probe to identify the etching endpoint.

FIG. 1 shows an example of monitoring ALE effluent 100 with a calorimetric probe to identify the etching endpoint. A layer of the material to be etched is formed 102 on a semiconductor wafer, e.g., deposited in a typical chemical vapor deposition (CVD) step. A mask is formed 104 on the layer, e.g., a carbon (C) or organic planarizing layer (OPL) mask, formed in a typical photolithographic masking step. ALE 106 begins the layer of the material, etching atomic layer by atomic layer, while using a calorimetric probe to measure 108 the effluent for material layer content. In a preferred example, Perfluoroisobutylene ($C_4F_8$), also octafluorocyclobutane, or hexafluorocyclobutene ($C_4F_6$) are the precursor gases for etching silicon oxide. Periodically checking 110 the content level, etching 106 continues until the level falls below an endpoint threshold. Preferably for ease of sorting, measuring 108 and checking 110 is restricted to a single reaction product. Once the effluent content indicates 110 etching has reached the endpoint, ALE 100 ends and fabrication continues to the next processing step 112.

Figure 2:
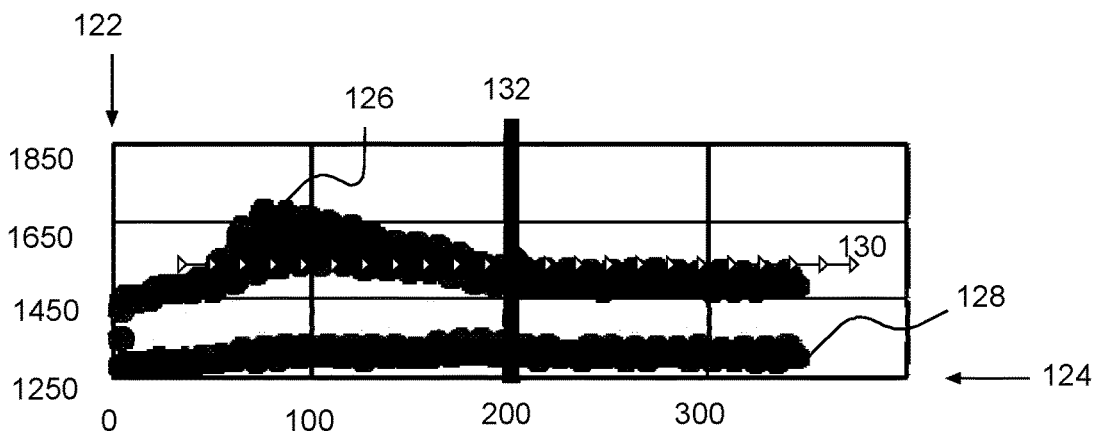
FIG. 2 shows an example of a plot of optical emission intensity over time from monitoring ALE effluent.

FIG. 2 shows an example of a plot 120 of optical emission intensity 122 over time 124 from monitoring ALE effluent, etching an oxide ($SiO_2$) layer on a nitride (SiN) layer in a conventional capacitively coupled plasma etcher. Etching an oxide, the signature emission product is a CO species 126, e.g., $COF_2$, in the presence of a CN species 128. In this example, the CO species 126 exhibits an initial jump to a base line 130 measurement, followed by a slight rise to some peak/equilibrium value, followed by a decline back to base line 130 at what may be considered the endpoint 132. The subtlety of the etching results, measured using this RIE-type optical emission spectroscopy, increases the likelihood of under-etching, or over-etching to compensate for the likelihood of under-etching.

The example of FIG. 3 shows a table 140 for determining (in steps 108, 110 in FIG. 1) a minimum detection level (MDL) of nitrogen ($N_2$) in argon in etch chamber effluent. Comparing sensitivity of detectable power in milliwatts (mw) 142 to nitrogen ($N_2$) 144 in argon in the etch chamber during etching 106, it is apparent that ten percent (10%) nitrogen provides a significant signal to noise ratio (S/N) 146 at about a half a milliwatt (0.51 mW). The minimum signal to noise ratio 146 at 1% $N_2$ is two (2) to one, i.e., the measured result is at least double until etching is complete 110. Thus, a signal to noise ratio 146 of thirteen (13) makes identifying the endpoint 110 relatively easy.

Thus, the example of FIG. 4 shows a table 150 comparing sensitivity of detectable power in milliwatts (mw) 152 to etch chamber pressure 154 in torrs at 10% nitrogen. While the power change from the presence of the monitored species is appreciable, even at 0.34 torr, the change is nearly double at 1 torr, and more or less plateaus a 2 torrs and above. Thus, for using ALE on oxide, a preferred operating point is 10% nitrogen in argon at least at 2 torr to arrive at a 13× S/N with 0.051 mW of peak signal. At this operating point ALE may be monitored for quickly and efficiently etching an oxide layer on a very thin silicon nitride (e.g., 5 nm) layer without etching or otherwise modifying the thin nitride layer or anything beneath the thin nitride layer, i.e., avoiding over or under etching the etched layer or otherwise causing damage to the IC.

While the example of FIGS. 3 and 4 is directed to ALE on oxide, collecting the same type of information for other etched materials provides a person skilled in the art with sufficient information to select an optimum operating point. Further, although described herein as used for etching silicon oxide ($SiO_2$) on a nitride (SiN) layer masked with a carbon mask, this is for example only. The present invention has application to etching almost any thin material layer formed above a different material and masked with a suitable mask, also of a material different than the material being etched, during state of the art integrated circuit manufacturing. The present invention has application to many different material classes, e.g., for etching carbon or silicon films.

Advantageously, ALE according to a preferred embodiment of the present invention allows for precisely etching very fine features and very fine layers without over or under etching and without inadvertently etching other layers or otherwise causing damage.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming integrated circuit (IC) chips, said method comprising:
   forming a layer of a material to be etched on a surface of a wafer;
   forming a mask on the layer;
   atomic layer etching said layer;
   measuring etch effluent with a calorimetric probe, said calorimetric probe reflecting content of a species of material in said etch effluent indicating the material is being etched from said layer;
   checking measured etch effluent results;
   returning to atomic layer etching said layer while said results indicate the content of said species is above a threshold value; and when said results indicate the content of said species is at or below said threshold value,
   continuing to a next IC fabrication step for a next IC chip layer.

2. A method of forming IC chips as in claim 1, wherein said calorimetric probe is a thermoelectric probe.

3. A method of forming IC chips as in claim 1, wherein when said results indicate the content of said species is below said threshold value, atomic layer etching said layer is complete and said method comprises continuing to a next IC fabrication step for a next IC chip layer.

4. A method of forming IC chips as in claim 1, wherein a signal to noise ratio of said measured etch effluent results is greater than two to one.

5. A method of forming IC chips as in claim 1 wherein atomic layer etching is in a capacitively coupled plasma etcher.

6. A method of forming IC chips as in claim 1, wherein atomic layer etching said layer is in a mixture of an inert gas with a second gas.

7. A method of forming IC chips as in claim 6, wherein said inert gas is argon (Ar).

8. A method of forming IC chips as in claim 7, wherein said layer is an oxide layer and said second gas is Nitrogen ($N_2$).

9. A method of forming IC chips as in claim 6, wherein the pressure of said gas mixture is less than ten torr (10 torr).

10. A method of forming IC chips as in claim 9, wherein said pressure of said gas mixture is between two and five torr (2 torr-5 torr).

11. A method of forming integrated circuit (IC) chips, said method comprising:
    forming a layer of a material to be etched on a surface of a wafer;
    forming mask on the layer;
    atomic layer etching said layer in a mixture of an inert gas with a second gas;
    measuring etch effluent with a calorimetric probe, said calorimetric probe reflecting content of a species of material in said etch effluent indicating the material is being etched from said layer;
    checking measured etch effluent results, wherein a signal to noise ratio of said measured etch effluent results is greater than two to one;
    returning to atomic layer etching said layer until said results indicate the content of said species is below a threshold value, wherein atomic layer etching said layer is complete; and
    continuing to a next IC fabrication step for a next IC chip layer.

12. A method of forming IC chips as in claim 11, wherein said calorimetric probe is a thermoelectric probe.

13. A method of forming IC chips as in claim 11 wherein atomic layer etching is in a capacitively coupled plasma etcher.

14. A method of forming IC chips as in claim 11, wherein said inert gas is argon (Ar).

15. A method of forming IC chips as in claim 14, wherein said layer is an oxide layer on a nitride surface layer of said wafer and said second gas is nitrogen ($N_2$).

16. A method of forming IC chips as in claim 11, wherein the pressure of said gas mixture is less than ten torr (10 torr).

17. A method of forming IC chips as in claim 16, wherein said pressure of said gas mixture is between two and five torr (2 torr-5 torr).

\* \* \* \* \*